(12) United States Patent
Jose et al.

(10) Patent No.: US 10,186,208 B2
(45) Date of Patent: Jan. 22, 2019

(54) LOW VOLTAGE DISPLAY DRIVER

(71) Applicant: Samsung Display Co., Ltd., Yongin-si, Gyeonggi-do (KR)

(72) Inventors: Anup P. Jose, San Jose, CA (US); Amir Amirkhany, Sunnyvale, CA (US)

(73) Assignee: Samsung Display Co., Ltd., Yongin-si (KR)

( * ) Notice: Subject to any disclaimer, the term of this patent is extended or adjusted under 35 U.S.C. 154(b) by 20 days.

(21) Appl. No.: 15/402,136

(22) Filed: Jan. 9, 2017

(65) Prior Publication Data

US 2018/0197485 A1    Jul. 12, 2018

(51) Int. Cl.
*G09G 3/32* (2016.01)
*G09G 3/36* (2006.01)
*G09G 3/3291* (2016.01)
*H01L 27/092* (2006.01)
*H01L 29/78* (2006.01)

(52) U.S. Cl.
CPC ......... *G09G 3/3291* (2013.01); *G09G 3/3614* (2013.01); *H01L 27/092* (2013.01); *G09G 2300/0426* (2013.01); *G09G 2300/0828* (2013.01); *G09G 2300/0871* (2013.01); *G09G 2310/027* (2013.01); *H01L 29/7816* (2013.01)

(58) Field of Classification Search
CPC .. G09G 3/3696; G09G 3/3688; G09G 3/3614; G09G 3/2096; G09G 2310/0291; G09G 2310/027; G09G 2330/021
See application file for complete search history.

(56) References Cited

U.S. PATENT DOCUMENTS 7,177,418 B2    2/2007    Maclean et al.
7,768,480 B2    8/2010    Onozawa et al.
(Continued)

FOREIGN PATENT DOCUMENTS

CN    101964329 B    9/2012
CN    102709325 A    10/2012
KR    10-0479765    3/2005

OTHER PUBLICATIONS

Ma, Shaoyu, et al., "4A Isolated Half-Bridge Gate Driver with 4.5V to 18V Output Drive Voltage," IEEE, 2014, pp. 1490-1493, Electronic ISBN: 978-1-4799-2325-0.

*Primary Examiner* — Xuemei Zheng
(74) *Attorney, Agent, or Firm* — Lewis Roca Rothgerber Christie LLP

(57) ABSTRACT

A column driver includes: an output stage including: a first transistor and a second transistor coupled in series between an output high voltage source and an output low voltage source; and an output node between the first transistor and the second transistor, the first transistor and the second transistor being configured to control an output voltage of the output node in an output voltage range; a first operational amplifier having a first operating voltage range, an output of the first operational amplifier being connected to a gate electrode of the first transistor, the first operating voltage range being smaller than the output voltage range; a second operational amplifier having a second operating voltage range, an output of the second operational amplifier being connected to a gate electrode of the second transistor; and a feedback network coupled between the output node and non-inverting inputs of the first and second operational amplifiers.

20 Claims, 9 Drawing Sheets

(56) References Cited

U.S. PATENT DOCUMENTS

| | | | |
|---|---|---|---|
| 7,898,783 B2 | 3/2011 | Kaya | |
| 8,110,997 B2 | 2/2012 | Muramatsu | |
| 8,253,399 B2 | 8/2012 | Peterson et al. | |
| 8,742,803 B2 | 6/2014 | Schuler | |
| 8,872,384 B2 | 10/2014 | Stratakos et al. | |
| 9,312,776 B2 | 4/2016 | Freeman et al. | |
| 9,431,914 B2 | 8/2016 | Freeman et al. | |
| 2002/0041274 A1* | 4/2002 | Watanabe | G09G 3/3614 345/204 |
| 2007/0139320 A1* | 6/2007 | Deane | G09G 3/3688 345/87 |
| 2009/0289930 A1* | 11/2009 | Nishimura | G09G 3/2011 345/211 |

* cited by examiner

LOW VOLTAGE DISPLAY DRIVER

FIELD

Aspects of embodiments of the present invention relate to a display device and a data driver of the display device.

BACKGROUND

Display devices such as organic light emitting diode (OLED) displays and liquid crystal displays (LCD) include a plurality of pixels at crossing regions defined by a plurality of scan lines extending in a row direction and a plurality of data lines extending in a column direction. A scan driver sequentially applies scan signals to the scan lines and a data driver supplies data signals to a plurality of data lines to write data to control the pixels to display images.

The data driver may include one or more digital-to-analog converters (DACs) to convert digital data to analog signals and one or more amplifier stages to amplify the analog data signals and to supply the amplified analog signals to the data lines.

The above information in the Background section is only for enhancement of understanding of the background of the technology and therefore it should not be construed as admission of existence or relevancy of the prior art.

SUMMARY

Aspects of embodiments of the present invention relate to a low voltage display driver. In some embodiments of the present invention, a data driver of a display device includes low voltage components, such as low voltage digital-to-analog converters and low voltage amplifiers, to control a high voltage output analog signal supplied through a plurality of data lines to the pixels of a display device, where the output analog signal varies within an output voltage range that is larger than the operating voltage ranges of the low voltage amplifiers.

According to one embodiment of the present invention, a column driver includes: an output stage including: a first transistor and a second transistor coupled in series between an output high voltage source and an output low voltage source; and an output node between the first transistor and the second transistor, the first transistor and the second transistor being configured to control an output voltage of the output node in an output voltage range; a first operational amplifier having a first operating voltage range, an output of the first operational amplifier being connected to a gate electrode of the first transistor, the first operating voltage range being smaller than the output voltage range; a second operational amplifier having a second operating voltage range, an output of the second operational amplifier being connected to a gate electrode of the second transistor; and a feedback network coupled between the output node and non-inverting inputs of the first and second operational amplifiers to provide a feedback voltage to the first and second operational amplifiers, the feedback network being configured to shift the feedback voltage from the output voltage range to the first and second operating voltage ranges.

The first transistor and second transistor may be LDMOS transistors.

The first transistor may be a p-type LDMOS transistor and the second transistor may be an n-type LDMOS transistor.

The first operational amplifier may be coupled to the output high voltage source and a first intermediate voltage source, a voltage range between the output high voltage source and the first intermediate voltage source may correspond to the first operating voltage range, the second operational amplifier may be coupled to the output low voltage source and a second intermediate voltage source, and a voltage difference between the output low voltage source and the second intermediate voltage source may correspond to the second operating voltage range.

The first intermediate voltage source and the second intermediate voltage source may be configured to supply the same voltage.

The first intermediate voltage source and the second intermediate voltage source may be configured to supply different voltages.

The feedback network may include a passive voltage divider.

An inverting input of the first operational amplifier may be coupled to an output of a digital-to-analog converter (DAC), the DAC being supplied with power in the first operating voltage range.

The column driver may further include a voltage level shifter coupled between the output of the DAC and an inverting input of the second operational amplifier, the voltage level shifter being configured to shift a voltage signal from the first operating voltage range to the second operating voltage range.

According to one embodiment of the present invention, a display device includes: a display unit including a plurality of pixels at crossing regions of a plurality of scan lines and a plurality of data lines; a scan driver coupled to the scan lines; a data driver including a plurality of column drivers coupled to the data lines, each of the column drivers including: an output stage including: a first transistor and a second transistor coupled in series between an output high voltage source and an output low voltage source; and an output node between the first transistor and the second transistor, the first transistor and the second transistor being configured to control an output voltage of the output node in an output voltage range; a first operational amplifier having a first operating voltage range, an output of the first operational amplifier being connected to a gate electrode of the first transistor, the first operating voltage range being smaller than the output voltage range; a second operational amplifier having a second operating voltage range, an output of the second operational amplifier being connected to a gate electrode of the second transistor; and a feedback network coupled between the output node and non-inverting inputs of the first and second operational amplifiers to provide a feedback voltage to the first and second operational amplifiers, the feedback network being configured to shift the feedback voltage from the output voltage range to the first and second operating voltage ranges.

Each column driver may include an input coupled to the first operational amplifier and the second operational amplifier, and the display device may further include a plurality of digital-to-analog converters (DACs) coupled to the inputs of the column drivers.

The display device may further include a plurality of multiplexers coupled between the DACs and the inputs of the column drivers.

A first multiplexer of the multiplexers may have a first input coupled to a first digital-to-analog converter (DAC) of the DACs, a second input coupled to a second DAC of the DACs, and an output coupled to an input of a first column driver of the column drivers, the first DAC being configured to output signals having a first polarity, and a second multiplexer of the multiplexers may have a first input coupled to a first digital-to-analog converter (DAC) of the DACs, a second input coupled to a second DAC of the DACs, and an output coupled to an input of a second column driver of the column drivers, the second DAC being configured to output signals having a second polarity different from the first polarity, wherein the first multiplexer may be configured to alternatingly couple the first and second DACs to the first column driver, and wherein the second multiplexer may be configured to alternatingly couple the second and first DACs to the second column driver.

An inverting input of the first operational amplifier may be coupled to the input of the column driver, and the column driver may further include a voltage level shifter coupled between the input of the column driver and an inverting input of the second operational amplifier, the voltage level shifter being configured to shift a voltage signal from the first operating voltage range to the second operating voltage range.

The first transistor and second transistor may be LDMOS transistors.

The first transistor may be a p-type LDMOS transistor and the second transistor may be an n-type LDMOS transistor.

The first operational amplifier may be coupled to the output high voltage source and a first intermediate voltage source, a voltage range between the output high voltage source and the first intermediate voltage source may correspond to the first operating voltage range, the second operational amplifier may be coupled to the output low voltage source and a second intermediate voltage source, and a voltage difference between the output low voltage source and the second intermediate voltage source may correspond to the second operating voltage range.

The first intermediate voltage source and the second intermediate voltage source may be configured to supply the same voltage.

The first intermediate voltage source and the second intermediate voltage source may be configured to supply different voltages.

The feedback network may include a passive voltage divider.

BRIEF DESCRIPTION OF THE DRAWINGS

The accompanying drawings, together with the specification, illustrate exemplary embodiments of the present invention, and, together with the description, serve to explain the principles of the present invention.

DETAILED DESCRIPTION

Figure 1:
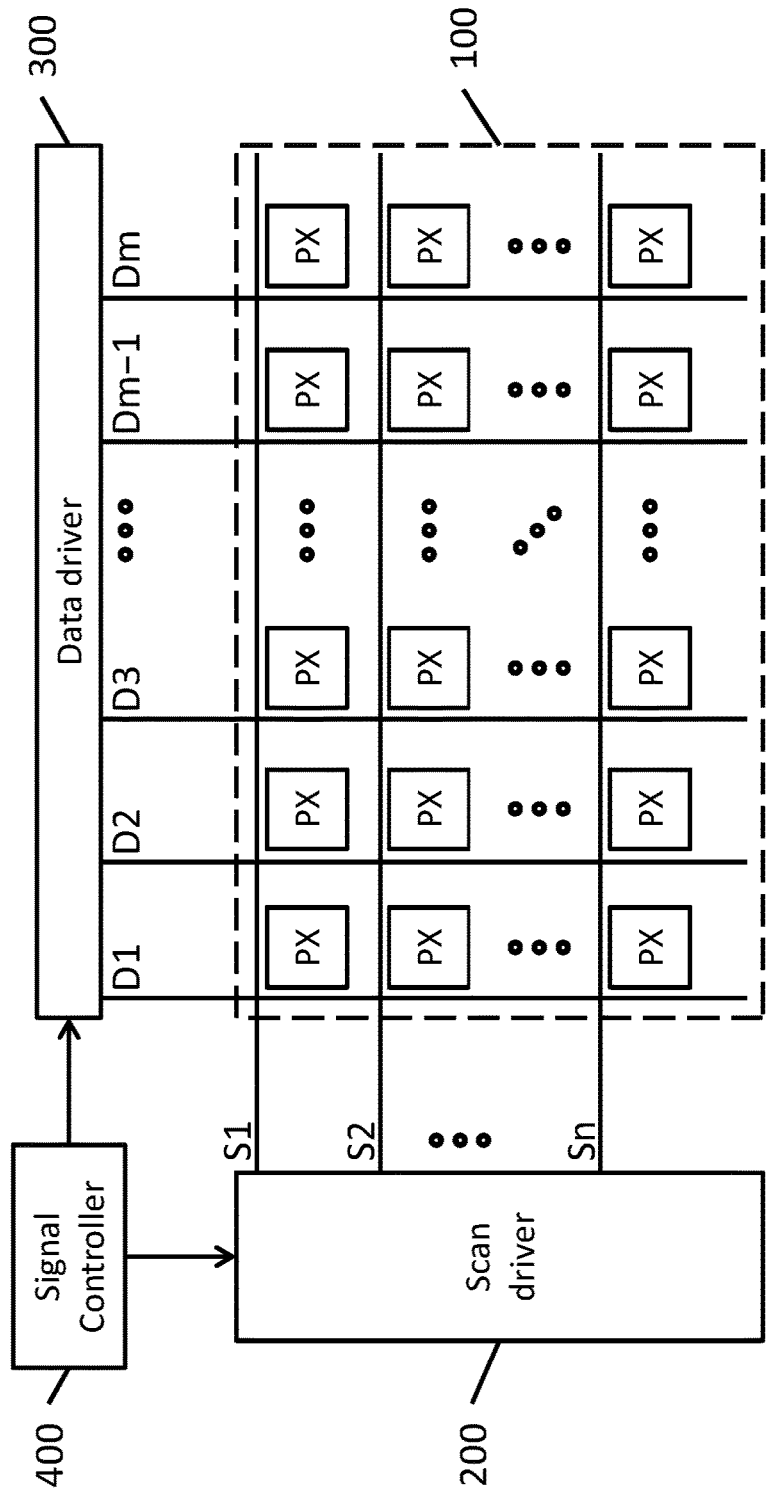
FIG. 1 is a block diagram of a display device according to one embodiment of the present invention.

Hereinafter, example embodiments will be described in more detail with reference to the accompanying drawings, in which like reference numbers refer to like elements throughout. The present invention, however, may be embodied in various different forms, and should not be construed as being limited to only the illustrated embodiments herein. Rather, these embodiments are provided as examples so that this disclosure will be thorough and complete, and will fully convey the aspects and features of the present invention to those skilled in the art. Accordingly, processes, elements, and techniques that are not necessary to those having ordinary skill in the art for a complete understanding of the aspects and features of the present invention may not be described. Unless otherwise noted, like reference numerals denote like elements throughout the attached drawings and the written description, and thus, descriptions thereof will not be repeated. In the drawings, the relative sizes of elements, layers, and regions may be exaggerated for clarity.

It will be understood that, although the terms "first," "second," "third," etc., may be used herein to describe various elements, components, regions, layers and/or sections, these elements, components, regions, layers and/or sections should not be limited by these terms. These terms are used to distinguish one element, component, region, layer or section from another element, component, region, layer or section. Thus, a first element, component, region, layer or section described below could be termed a second element, component, region, layer or section, without departing from the spirit and scope of the present invention.

Spatially relative terms, such as "beneath," "below," "lower," "under," "above," "upper," and the like, may be used herein for ease of explanation to describe one element or feature's relationship to another element(s) or feature(s) as illustrated in the figures. It will be understood that the spatially relative terms are intended to encompass different orientations of the device in use or in operation, in addition to the orientation depicted in the figures. For example, if the device in the figures is turned over, elements described as "below" or "beneath" or "under" other elements or features would then be oriented "above" the other elements or features. Thus, the example terms "below" and "under" can encompass both an orientation of above and below. The device may be otherwise oriented (e.g., rotated 90 degrees or at other orientations) and the spatially relative descriptors used herein should be interpreted accordingly.

It will be understood that when an element or layer is referred to as being "on," "connected to," or "coupled to" another element or layer, it can be directly on, connected to, or coupled to the other element or layer, or one or more intervening elements or layers may be present. In addition, it will also be understood that when an element or layer is referred to as being "between" two elements or layers, it can be the only element or layer between the two elements or layers, or one or more intervening elements or layers may also be present.

The terminology used herein is for the purpose of describing particular embodiments only and is not intended to be limiting of the present invention. As used herein, the singular forms "a" and "an" are intended to include the plural forms as well, unless the context clearly indicates otherwise. It will be further understood that the terms "comprises," "comprising," "includes," and "including," when used in this specification, specify the presence of the stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. Expressions such as "at least one of," when preceding a list of elements, modify the entire list of elements and do not modify the individual elements of the list.

As used herein, the term "substantially," "about," and similar terms are used as terms of approximation and not as terms of degree, and are intended to account for the inherent deviations in measured or calculated values that would be recognized by those of ordinary skill in the art. Further, the use of "may" when describing embodiments of the present invention refers to "one or more embodiments of the present invention." As used herein, the terms "use," "using," and "used" may be considered synonymous with the terms "utilize," "utilizing," and "utilized," respectively. Also, the term "exemplary" is intended to refer to an example or illustration.

Unless otherwise defined, all terms (including technical and scientific terms) used herein have the same meaning as commonly understood by one of ordinary skill in the art to which the present invention belongs. It will be further understood that terms, such as those defined in commonly used dictionaries, should be interpreted as having a meaning that is consistent with their meaning in the context of the relevant art and/or the present specification, and should not be interpreted in an idealized or overly formal sense, unless expressly so defined herein.

FIG. 1 is a block diagram of a display device according to one embodiment of the present invention. Referring to FIG. 1, the display device includes a display unit 100, a scan driver 200 and a data driver 300 connected thereto, and a signal controller 400 for controlling the scan driver 200 and the data driver 300.

In an exemplary embodiment, the display unit 100 includes a plurality of display signal lines (S1-Sn, D1-Dm) and a plurality of pixels (PX) connected thereto and substantially arranged in a matrix form.

The display signal lines (S1-Sn, D1-Dm) include a plurality of scan lines (S1-Sn) for transmitting scan signals (also called gate signals) and data lines (D1-Dm) for transmitting data signals. The scan lines (S1-Sn) extend along a row direction and are substantially parallel with each other, and the data lines (D1-Dm) extend in a column direction and are substantially parallel with each other. The pixels PX are located at crossing regions of the scan lines (S1-Sn) and the data lines (D1-Dm).

The scan driver 200 is connected to the scan lines (S1-Sn) and applies a scan signal formed by combination of a gate-on voltage and a gate-off voltage to the scan lines (S1-Sn). The gate-on voltage represents a voltage that is applied to a gate of a transistor to turn on the transistor, and the gate-off voltage represents a voltage that is applied to the gate of the transistor to turn it off.

The data driver 300 is connected to the data lines (D1-Dm), generates a data signal for indicating a grayscale value of the pixel (PX), and applies it to the data lines (D1-Dm).

The signal controller 400 controls the scan driver 200 and the data driver 300. For example, the signal controller 400 supplies data (e.g., digital data) to the data driver 300 and may also supply synchronization signals (VSYNC and HSYNC) to the scan driver 200 and/or the data driver 300 to synchronize the writing of the data to the pixels PX with the scan signals to set the pixels PX into a writable state. The data supplied to the data driver 300 may be digital data (e.g., where the data to be supplied to each data line is encoded as an 8-bit value) representing the luminance or gray level of the light to be emitted by a pixel.

Each pixel (PX) may include a transistor that includes a gate electrode connected to the scan line and source and drain electrodes connected to a corresponding one of the data lines (e.g., the data line corresponding to the column that the pixel is in). The transistor transmits the data signal provided by the data line in response to the gate-on voltage provided by the scan line, and the data signal controls the gray level of the light emitted by the pixel. When the display device is a liquid crystal display (LCD), the light emitting region may include a capacitor for storing the data signal, and a liquid crystal layer may control a level of brightness of light emitted according to the data signal stored in the capacitor. When the display device is an organic light emitting device (e.g., an active organic light emitting device), the light emitting region may include a capacitor for storing the data signal, a driving transistor for transmitting a current according to the data signal stored in the capacitor, and an organic light emitting diode (OLED) for emitting light having a gray level in accordance with the current provided by the driving transistor.

The drivers 200, 300, and 400 may be respectively mounted on the display unit 100 as at least one integrated circuit chip, may be mounted on a flexible printed circuit film (not shown) and be attached to the display unit 100 as a tape carrier package (TCP), or may be mounted on an additional printed circuit board (not shown). Alternatively, the drivers 200, 300, and 400 may be integrated with the display unit 100 together with the signal lines (S1-Sn, D1-Dm) and the transistors. Also, the drivers 200, 300, and 400 may be integrated into a single chip, and in this case, at least one of them or at least one circuit element forming them may be provided outside the single chip.

Figure 2:
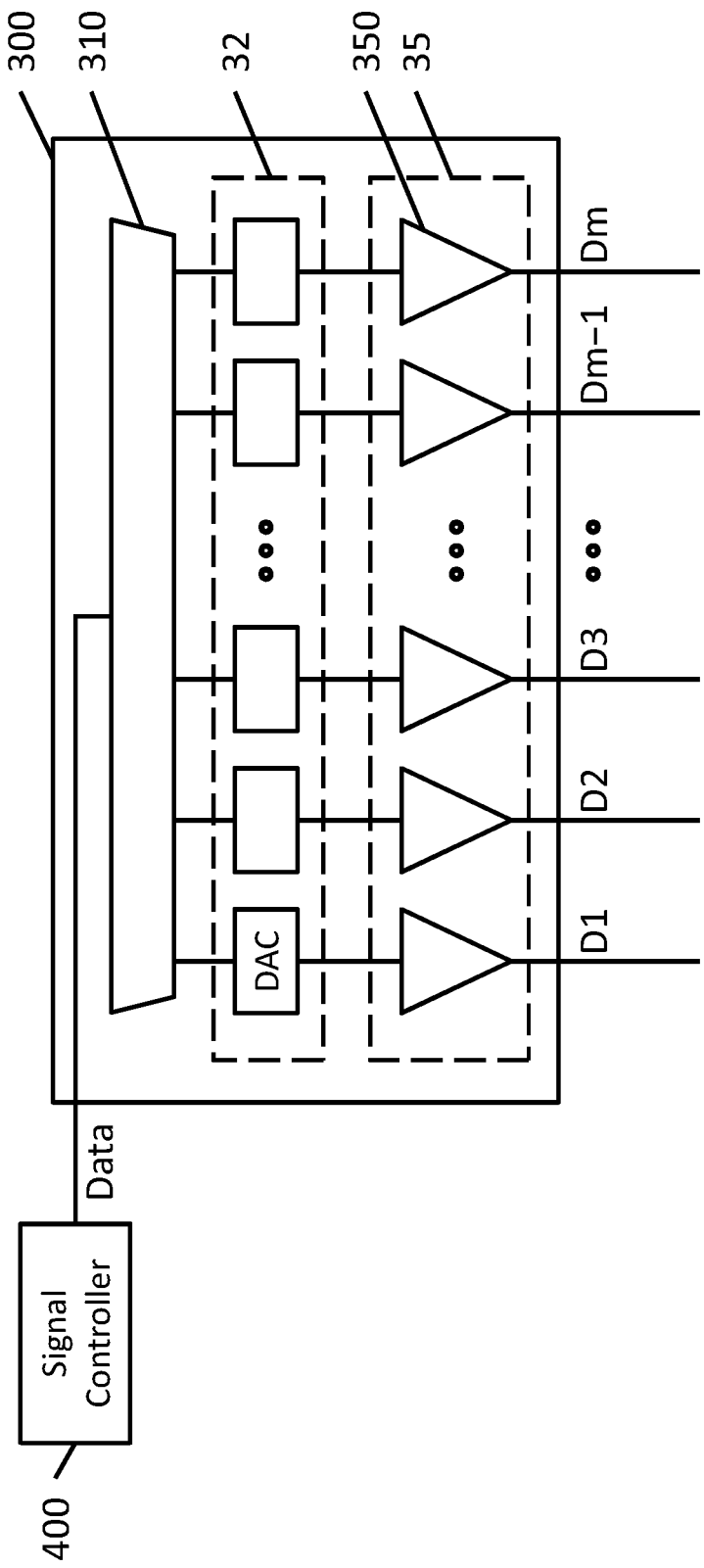
FIG. 2 is a block diagram of a data driver according to one embodiment of the present invention.

FIG. 2 is a block diagram of a data driver 300 according to one embodiment of the present invention. Referring to FIG. 2, the signal controller 400 is coupled to the data driver 300 to supply digital data signals Data to a digital demultiplexer 310. The demultiplexer 310 demultiplexes the digital data to generate m separate data digital data signals, one for each column of the display unit 100. The m digital data signals are supplied to digital-to-analog converters 32, which are configured to output analog data signals to an amplifier or column driver stage 35, which includes amplifiers or column drivers 350. The amplifiers or column drivers 350 amplify the analog signals to the operating voltage and current specifications of the pixels and output the amplified signals to the data lines D1-Dm.

Although FIG. 2 illustrates that each data line D1-Dm is coupled to a corresponding amplifier and a corresponding digital-to-analog converter, embodiments of the present invention are not limited thereto, as will be described in more detail below.

Figure 3:
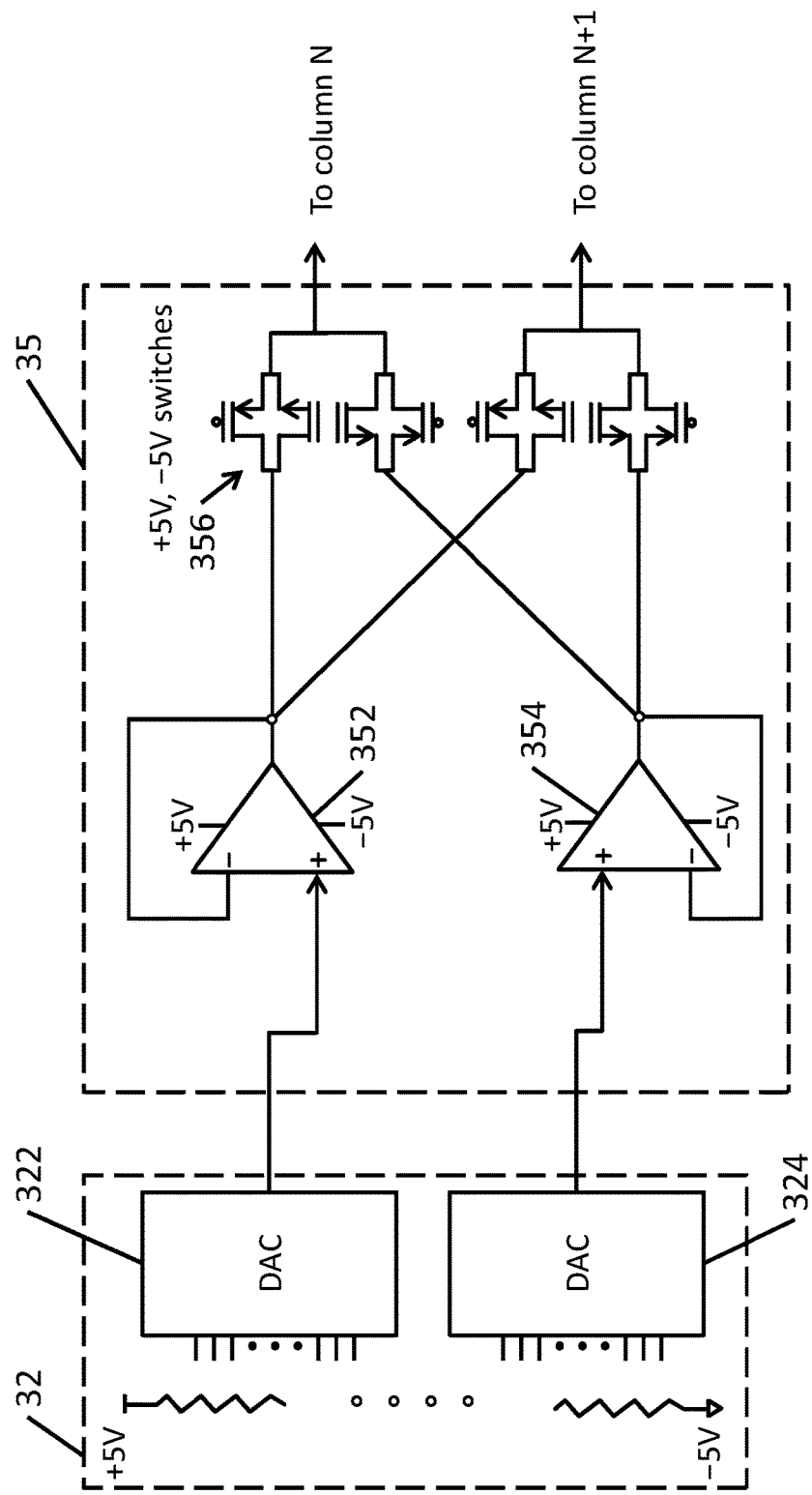
FIG. 3 is a block diagram of a portion of a related art data driver showing the DACs and column drivers associated with two columns.

FIG. 3 is a block diagram of a portion of a related art data driver showing the DACs and amplifiers associated with two columns. The data driver shown in FIG. 3 may be configured for use in driving a display device in which the output analog data signals supplied to the pixels PX via the data lines range from −5V to +5V (a 10V range). Typical display devices operated with a 10V output data voltage range include small display panels for use in mobile devices such as smartphones, personal digital assistants, and tablet computers. The output data voltage range may be different in other applications, such as televisions, in which the voltages of the data signals supplied to the pixels typically range from −9V to 9V (an 18V range). As shown in FIG. 3, upper and lower portions 322 and 324 of a digital-to-analog converter of the DAC stage 32 receive digital signals for columns N and N+1 (e.g., an Nth data line and an N+1th data line). As shown in FIG. 3, the upper portion 322 is supplied with a positive voltage +5V and the lower portion DAC 324 is supplied with a negative voltage −5V. As such, the lower portion DAC 324 has an output voltage having an inverted polarity when compared with the output of the upper portion DAC 322.

The analog outputs of the DAC stage are supplied to an amplifier stage 35. In particular, the first DAC 322 supplies its analog output to the non-inverting input of a first operational amplifier (op-amp) 352, and the second DAC 324 supplies its analog output to the non-inverting input of a second op-amp 354.

The outputs of the op-amps 352 and 354 are connected to their inverting inputs as feedback, and also connected to a plurality of switches 356 that selectively couple the op-amp outputs to columns (or data lines) N and N+1. The switches 356 functionally act as multiplexers that multiplex the outputs of the op-amps 352 and 354 to columns N and N+1. In particular, during one time interval (e.g., a first frame when implementing column inversion or a horizontal period when implementing dot or pixel inversion), the switches 356 are driven to connect the output of the first op-amp 352 to column N and to connect the output of the second op-amp 354 to column N+1. During another time interval (e.g., a following frame), the switches are driven to connect the output of first op-amp 352 to column N+1 and to connect the output of the second op-amp 354 to column N. By alternating the connections between the data lines and the op-amps 352 and 354, the polarity of the driving voltage can alternate in accordance with the control of the switches 356. Alternating polarity of the data signals can improve the performance or lifetime of some types of displays (e.g., liquid crystal displays).

Because the analog data signals to be supplied to the data lines is in the range of −5V to +5V, and because the switches 356 merely pass through the amplifier outputs without voltage gain, the DACs 322 and 324 and the op-amps 352 and 354 are high voltage devices that have operational voltage ranges that are the same as the output voltage range of the display unit (e.g., −5V to +5V). As such, the DACs 322 and 324 and the op-amps 352 and 354 are supplied with 10V (−5V to +5V) power. In addition, the switches 356 are high voltage devices (e.g., capable of withstanding 10V). The use of high-voltage DACs, op-amps, and switches can increase the cost of manufacturing when compared with low-voltage DACs, op-amps, and switches (e.g., 5V). As discussed above, other applications may use even higher voltages. For example, television display panels may require the use of DACs and op-amps capable of tolerating 20V voltage ranges.

Figure 4:
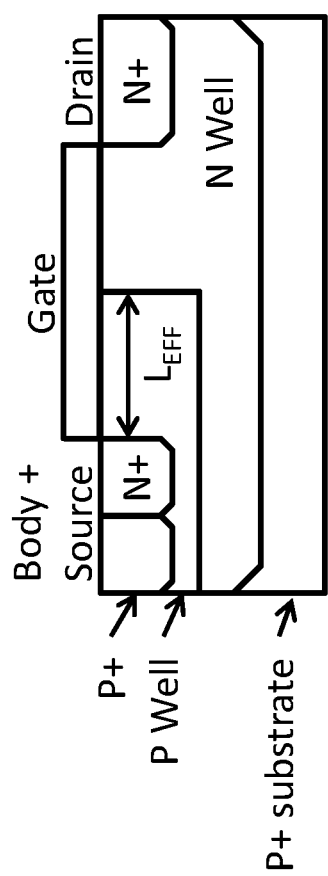
FIG. 4 is a cross-sectional diagram of an example of an n-type laterally diffused metal oxide semiconductor (NLD-MOS) transistor.

FIG. 4 is a cross-sectional diagram of an example of an n-type laterally diffused metal oxide semiconductor (NLDMOS) transistor. An LDMOS transistor can generally tolerate high drain-source voltages (e.g., $V_{DS}$<40V), and is controlled with low gate source voltages (e.g., $V_{GS}$<5V).

Figure 5:
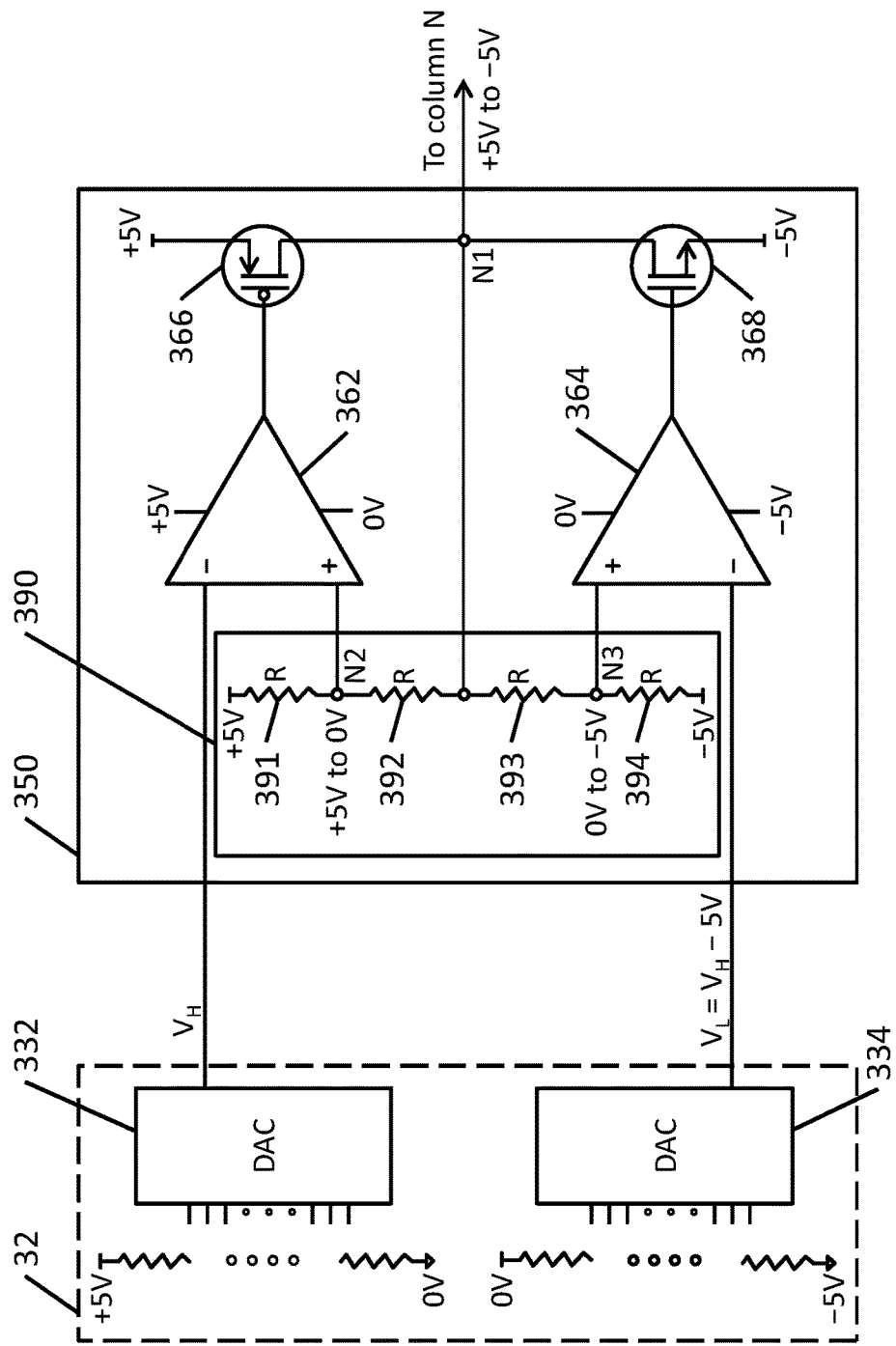
FIG. 5 is a block diagram illustrating a portion of a data driver including a digital-to-analog converter (DAC) and a column driver configured to drive one column or data line of a display device according to one embodiment of the present invention.

FIG. 5 is a block diagram illustrating a column driver 350 of a data driver 300 configured to drive one column or data line of a display unit 100 according to one embodiment of the present invention. The output voltage range of the column driver 350 is −5V to +5V, a high-voltage 10V range. The DACs 32 include a first DAC 332 and a second DAC 334, where the first DAC 322 outputs a higher voltage $V_H$ (e.g., a voltage in a first operational range of 0V to +5V) and the second DAC 324 outputs a lower voltage $V_L$ (e.g., a voltage in a second operational range of −5V to 0V). In this embodiment, $V_L=V_H-5V$. In contrast to the arrangement of FIG. 3, each of the DACs is a low-voltage device (in the embodiment of FIG. 5, each is supplied with 5V power). The outputs of the DACs 32 are supplied to a column driver 350. As shown in FIG. 5, the outputs of the DACs 332 and 334 are coupled to the inverting inputs of the op-amps 362 and 364.

The column driver 350 includes low-voltage operational amplifiers (op-amps) 362 and 364. These op-amps may be supplied with a low voltage power, such as 5V. In the embodiment of FIG. 5, the first op-amp 362 is supplied with 0V and +5V, and the second op-amp 364 is supplied with −5V and 0V. In other words, the first op-amp 362 is coupled to a output high voltage source supplying +5V and coupled to an intermediate voltage source supplying 0V such that the first op-amp is supplied with power corresponding to its operating range (+5V to 0V). Similarly, the second op-amp 364 is coupled to a output low voltage source supplying −5V and coupled to an intermediate voltage source supplying 0V such that the second op-amp 364 is supplied with power corresponding to its operating range (0V to −5V).

The outputs of the op-amps 362 and 364 are coupled to the gate electrodes of a pair of transistors 366 and 368 in a push-pull arrangement, where the first transistor 366 may be a p-type transistor having a gate electrode coupled to the output of the first op-amp 362, a first electrode coupled to the output high voltage source (e.g., +5V), and a second electrode coupled to an output node N1. The first transistor 366 may be considered the pull-up transistor of the pair. The second transistor 368 may be an n-type transistor having a gate electrode coupled to the output of the second op-amp 364, a first electrode coupled to the output node N1, and a second electrode coupled to the output low voltage source (e.g., −5V). The second transistor 368 may be considered the pull-down transistor of the pair. The transistors 366 and 368 may be high-voltage transistors, such as LDMOS transistors (e.g., the first transistor 366 may be a p-type LDMOS or PLDMOS transistor and the second transistor 368 may be an n-type LDMOS or NLDMOS transistor). As such, the analog voltage at the output node N1 is controlled to vary in the range −5V to +5V.

The output node N1 is coupled to the data line (or the Nth column) to supply analog data signals to the pixels. The output node N1 is also coupled to the op-amps 362 and 364 to supply a feedback signal. Because the range of output voltages at the output node N1 (e.g., 10V) is greater than the operating voltage (or rail-to-rail voltage) of the low-voltage op-amps 362 and 364 (e.g., 5V), the feedback signal is shifted or scaled to an appropriate range to satisfy the voltage headroom of the op-amps 362 and 364. In the embodiment shown in FIG. 5, a feedback network 390 includes a passive voltage divider to reduce the feedback voltages provided to the op-amps 362 and 364 at nodes N2 and N3. The passive voltage divider includes four resistors 391, 392, 393, and 394 connected in series between the output high voltage source (+5V) and the output low voltage source (−5V) to shift the voltage of the feedback signal. Because the output voltage (10V) is twice the operating voltage of the op-amps (5V), the feedback signal is halved. Accordingly, all four resistors have the same resistance value R. In other embodiments of the present invention, the resistors may have different values (or different relative values) in accordance with the operating voltage ranges ($V_{Op}$) of the op-amps and the voltage range of the output ($V_{Out}$), as described in more detail below.

As shown in FIG. 5, the first resistor 391 is connected between the high voltage source (e.g., +5V) and a second node N2. The second resistor 392 is connected between the second node N2 and the output node N1. The third resistor 393 is connected between the output node N1 and a third node N3, and the fourth resistor 394 is connected between the third node N3 and the low voltage source (e.g., −5V). The second node N2 is connected to the non-inverting input of the first op-amp 362, and the third node N3 is connected to the non-inverting input of the second op-amp 364.

The voltages at nodes N2 and N3 vary in accordance with the voltage of the output node N1. In the example shown in FIG. 5, the voltage of the output node N1 varies from +5V to −5V, and therefore the voltage of the second node N2 varies from +5V to 0V, and the voltage of the third node N3 varies from 0V to −5V. As such, the feedback voltages supplied to the low-voltage op-amps 362 and 364 are scaled to voltages within the headroom of the corresponding amplifiers.

While the feedback network 390 is illustrated as a passive feedback network of four resistors, embodiments of the present invention are not limited thereto and may be implemented using other circuits such as active virtual grounds or rail splitters.

As such, the embodiment shown in FIG. 5 allows the use of low-voltage op-amps 362 and 364 operating at a lower voltage or smaller voltage range (e.g., 5V) than the output voltage supplied to the data lines (e.g., 10V).

To supply an analog signal to the Nth column using the circuit shown in FIG. 5, the same digital data signal supplied to both the first DAC 332 and the second DAC 334. The first and second DACs then output corresponding analog voltages $V_H$ and $V_L$ (as noted above, $V_L = V_H - 5V$) to the op-amps 362 and 364, which control the push-pull transistors 366 and 368 to control the voltage of the output node N1, which supplies an analog output voltage, in the range of −5V to +5V, corresponding to the digital data signal.

Figure 6:
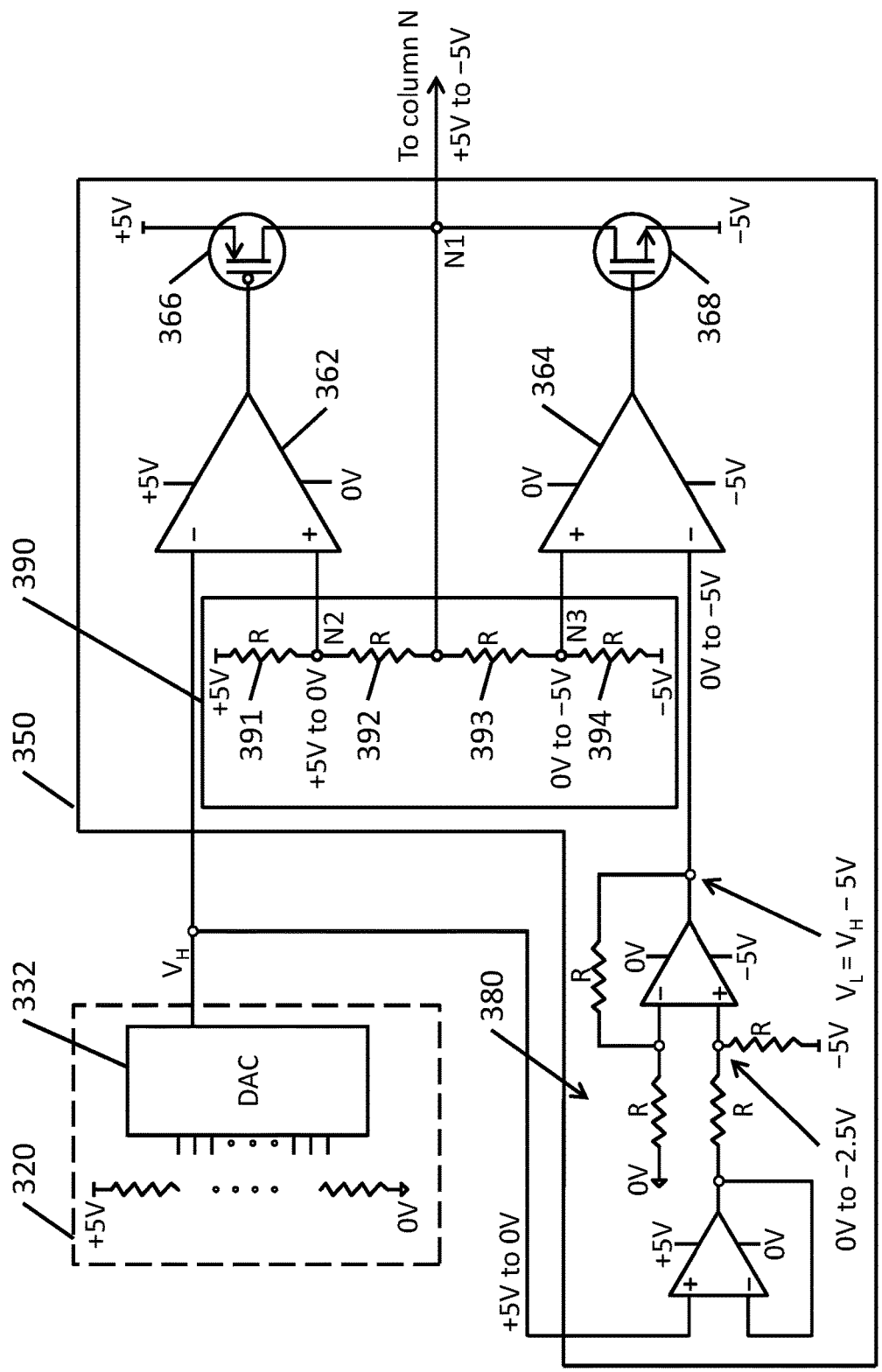
FIG. 6 is a block diagram illustrating a portion of a data driver including a DAC and a column driver according to one embodiment of the present invention.

FIG. 6 is a block diagram illustrating a portion of a data driver according to one embodiment of the present invention. In the embodiment shown in FIG. 5, the same digital signal is supplied to two different DACs in order to produce high voltage $V_H$ and low voltage $V_L$ analog signals corresponding to the same data signal. FIG. 6 illustrates another embodiment of the present invention in which the low voltage analog signal $V_L$ is generated from the high voltage analog signal $V_H$ by a voltage level shifter (or voltage level shifting circuit) 380, where $V_L = V_H - 5V$. The voltage level shifter 380 is, physically, a significantly smaller circuit than a DAC and therefore this embodiment reduces the area used by the data driver 300. Reducing the area of the data driver can reduce manufacturing costs (e.g., due to reduced materials used) and may also allow reductions in the width of a bezel surrounding a display device.

While the voltage shifting circuit is illustrated in FIG. 6 as using two op-amps, embodiments of the present invention are not limited thereto and may be implemented by other equivalent circuits for performing the effect of shifting the voltage output voltage.

In addition, while FIG. 6 illustrates an embodiment in which the DAC generates signals in a positive operating voltage range (+5V to 0V), embodiments of the present invention are not limited thereto. In other embodiments of the present invention, the DAC generates signals in a negative voltage range (e.g., 0V to −5V), and the voltage level shifter 380 may be configured to shift the voltage level from the negative operating voltage range to the positive operating voltage range.

Figure 7:
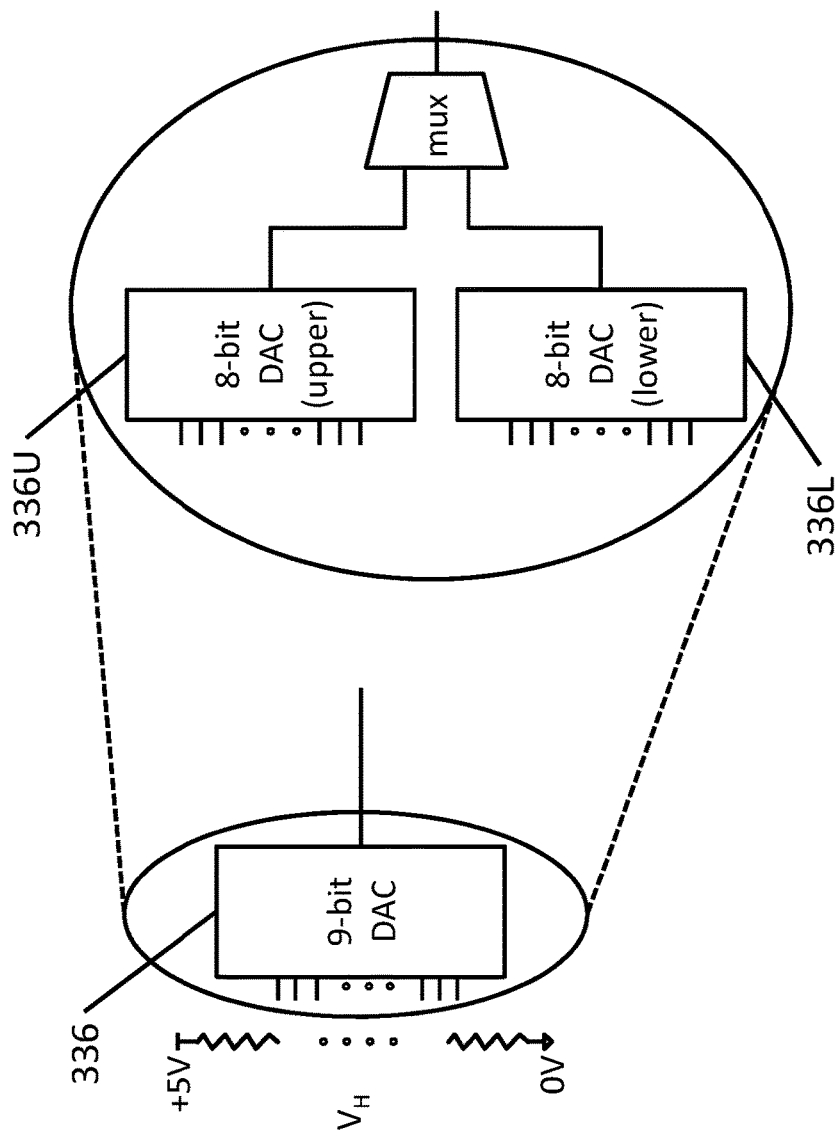
FIG. 7 is an illustration of a 9-bit DAC as functionally including two 8-bit DACs.

As shown in FIG. 7, a typical 9-bit DAC 336 includes two 8-bit DACs 336U and 336L having outputs coupled together by a multiplexer (mux). A typical 9-bit DAC occupies less space than two 8-bit DACs. As such, the area of a data driver can be further reduced by driving two columns or data lines of the display device using a single 9-bit DAC (assuming that the data signals are specified using 8-bit data), as shown in FIG. 8.

Figure 8:
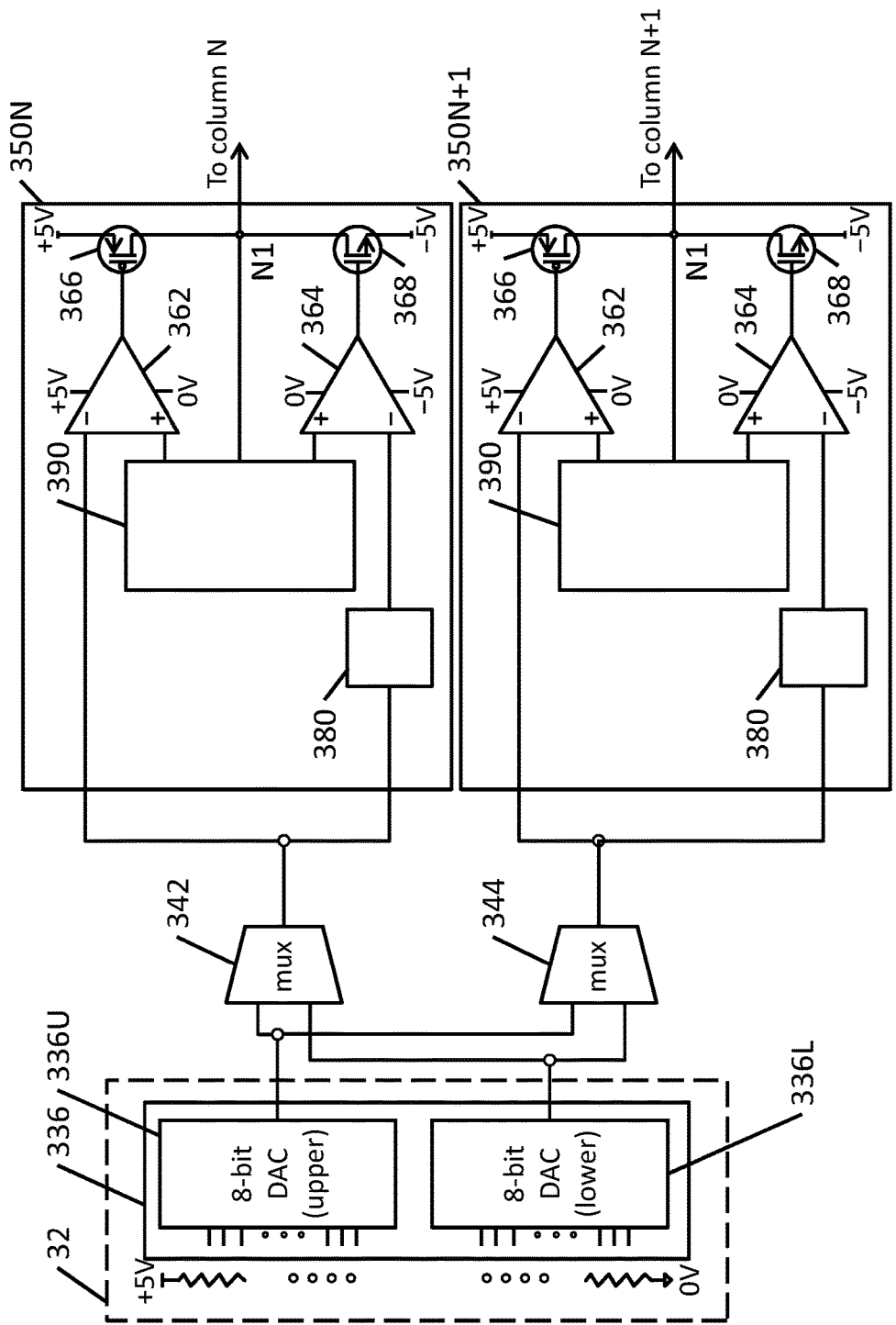
FIG. 8 is a block diagram illustrating a portion of a data driver including a DAC and two column drivers according to one embodiment of the present invention.

FIG. 8 is a block diagram illustrating a portion of a data driver according to one embodiment of the present invention. In the embodiment of FIG. 7, two column drivers 350N and 350N+1 that are substantially similar to the column driver 350 of FIG. 6 supply analog driving signals to two different columns (N and N+1) or data lines (e.g., data lines Dj and Dj+1) of the data lines D1-Dm of the display unit 100. In the embodiment of FIG. 8, a single DAC 336 (e.g., a 9-bit DAC) includes upper and lower portions 336U and 336L, where these upper and lower portions are functionally equivalent to two separate DACs 336U and 336L (e.g., two 8-bit DACs). As shown in FIG. 8, the upper DAC 336U is configured to output higher voltage signals than the lower DAC 336L (e.g., the upper DAC 336U is configured to output positive voltage signals and the lower DAC 336L is configured to output negative voltage signals).

Two multiplexers 342 and 344 selectively connect the 8-bit DACs 336U and 336L to the column drivers 350N and 350N+1. For example, during a first time period, the first mux 342 connects the upper DAC 336U to the first column driver 350N and disconnects the lower DAC 336L from the first column driver 350N. During the same time period, the second mux 344 connects the lower DAC 336L to the second column driver 350N+1 and disconnects the upper DAC 336U from the second column driver 350N+1. The time period may be, for example, a frame (e.g., a period for supplying data signals for all of the pixels PX of a display unit) or may be a single horizontal period (e.g., a period for suppling data signals to a single row of pixels, where a row of pixels may correspond to all of the pixels coupled to a single one of the scan lines S1-Sn). During another time period, the first mux 342 connects the lower DAC 336L to the first column driver 350N and disconnects the upper DAC 336U from the first column driver 350N, and, concurrently, the second mux 344 connects the upper DAC 336U to the second column driver 350N+1 and disconnects the lower DAC 336L from the second column driver 350N+1.

As such, the multiplexers 342 and 344 alternatingly supply analog voltage signals to the column drivers 350N and 350N+1. Because the upper and lower DACs 336U and 336L output analog voltages of opposite polarity, the multiplexers 342 and 344 are controlled to apply data voltage inversion to the pixels, thereby improving the operating lifetime of the pixels. In addition, because the upper and lower DACs 336U and 336L alternatingly drive columns N and N+1, in some embodiments, the demultiplexer 310 supplies the data bits to the appropriate DAC during each time period in accordance with which column the DAC is connected to during that time period.

Figure 9:
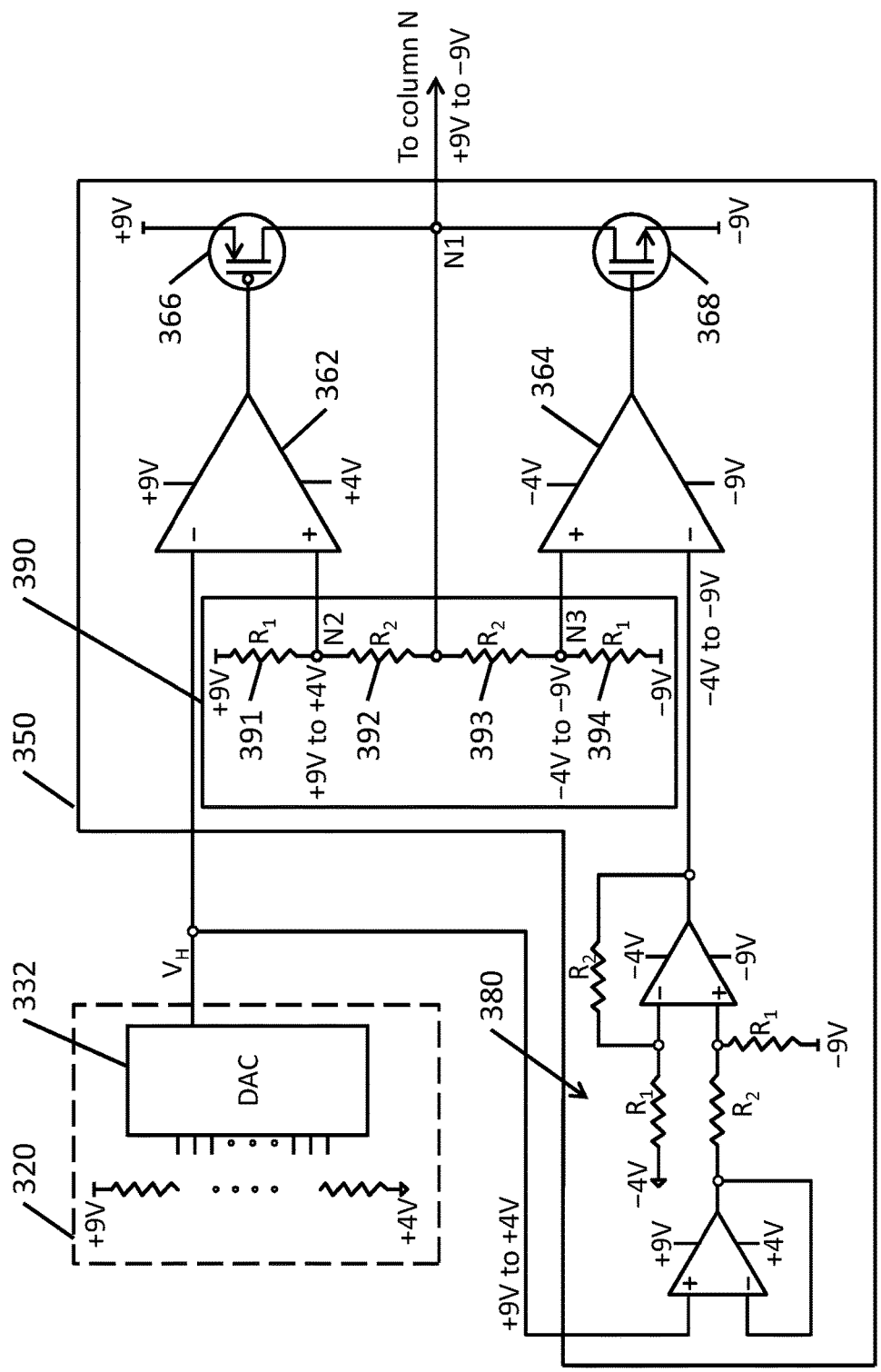
FIG. 9 is a block diagram illustrating a portion of a data driver including a column driver according to one embodiment of the present invention.

While some embodiments of the present invention are described above with respect to a data driver configured to output voltages over a range of 10V (e.g., from −5V to +5V), embodiments of the present invention are not limited thereto. For example, in some display devices such as televisions, the output voltages range over 18V (e.g., from −9V to +9V). FIG. 9 is a block diagram illustrating a portion of a data driver for driving a single column according to one embodiment of the present invention. The column driver 350 shown in FIG. 9 is substantially similar to the circuit shown in FIG. 6, except that the voltages of the power sources (or voltage sources) connected to various portions of the column driver differ. In particular, the four different supplies (or power sources) are used: +/−9V (the output high and low voltage sources) and +/−4V (first and second intermediate voltage sources). The first op-amp 362 is connected to the output high voltage source (+9V) and the first intermediate voltage source (+4V) to supply it with power corresponding to its operating voltage range (+9V to +4V). The second op-amp 364 is connected to the output low voltage source (−9V) and the second intermediate voltage source (−4V) to supply it with power corresponding to its operating voltage range (−4V to −9V). The feedback network 390 is coupled between the output high voltage source (+9V) and the output low voltage source (−9V). The DAC 332 is coupled between the high voltage source (+9V) and the first intermediate voltage source (+4V) to supply it with power corresponding to its operating voltage range. Various portions of the voltage level shifter 380 are supplied with all four voltages to perform the voltage shift from the first operating range (+9V to +4V) of the first op-amp 362 to the second operating range (−4V to −9V) of the second op-amp 364.

In addition, the relative resistances of the resistors of the feedback network 390 have a relationship that scales the feedback signal from the output range to the low-voltage range of the low-voltage op-amp. In this example, to scale the 18V output range ($V_{Out}$) to the 5V operating range ($V_{Op}$) of the op-amps 362 and 364, the ratio of the resistances $R_1$ and $R_2$ are: $R_1/R_2=5/13$. More generally:

$$\frac{V_{Op}}{V_{Out}} = \frac{R_1}{R_1 + R_2}$$

Similarly, the resistors of the voltage level shifter 380 are set according to the same ratios to shift the voltage $V_H$ output by the DAC 332 in a first operational range (+9V to +4V) to a level appropriate to the second op-amp 362 in a second operational range (−4V to −9V).

The high voltage output at node N1 is achieved through the use of low power components (e.g., the 5V DACs and 5V op-amps) controlling high-voltage transistors 336 and 338 (e.g., the LDMOS transistors). LDMOS transistors, in particular, are generally able to withstand a drain-source voltage ($V_{DS}$) up to 40V. As such, the 18V voltage range of this particular application is well within (less than half) of the maximum of the high-voltage transistors, thereby reducing voltage stress on the output transistors 336 and 338.

While the present invention has been described in connection with certain exemplary embodiments, it is to be understood that the invention is not limited to the disclosed embodiments, but, on the contrary, is intended to cover various modifications and equivalent arrangements included within the spirit and scope of the appended claims, and equivalents thereof.

What is claimed is:

1. A column driver comprising:
   an output stage comprising:
      a first transistor and a second transistor coupled in series between an output high voltage source and an output low voltage source; and
      an output node between the first transistor and the second transistor, the first transistor and the second transistor being configured to control an output voltage of the output node in an output voltage range;
   a first operational amplifier having a first operating voltage range, an output of the first operational amplifier being connected to a gate electrode of the first transistor, an inverting input of the first operational amplifier being configured to receive a first input voltage in the first operating voltage range, the first operating voltage range being smaller than the output voltage range;
   a second operational amplifier having a second operating voltage range, an output of the second operational amplifier being connected to a gate electrode of the second transistor, an inverting input of the second operational amplifier being configured to receive a second input voltage in the second operating voltage range, the second operating voltage range being different from the first operating voltage range; and
   a feedback network coupled between the output node and non-inverting inputs of the first and second operational amplifiers to provide a feedback voltage to the first and second operational amplifiers, the feedback network being configured to shift the feedback voltage from the output voltage range to the first and second operating voltage ranges.

2. The column driver of claim 1, wherein the first transistor and second transistor are LDMOS transistors.

3. The column driver of claim 2, wherein the first transistor is a p-type LDMOS transistor and the second transistor is an n-type LDMOS transistor.

4. The column driver of claim 1, wherein the first operational amplifier is coupled to the output high voltage source and a first intermediate voltage source,
   wherein a voltage range between the output high voltage source and the first intermediate voltage source corresponds to the first operating voltage range,
   wherein the second operational amplifier is coupled to the output low voltage source and a second intermediate voltage source, and
   wherein a voltage difference between the output low voltage source and the second intermediate voltage source corresponds to the second operating voltage range.

5. The column driver of claim 4, wherein the first intermediate voltage source and the second intermediate voltage source are configured to supply the same voltage.

6. The column driver of claim 4, wherein the first intermediate voltage source and the second intermediate voltage source are configured to supply different voltages.

7. The column driver of claim 1, wherein the inverting input of the first operational amplifier is coupled to an output of a digital-to-analog converter (DAC), the DAC being supplied with power in the first operating voltage range.

8. The column driver of claim 7, further comprising a voltage level shifter coupled between the output of the DAC and the inverting input of the second operational amplifier, the voltage level shifter being configured to shift a voltage signal from the first operating voltage range to the second operating voltage range.

9. A column driver comprising:
   an output stage comprising:
      a first transistor and a second transistor coupled in series between an output high voltage source and an output low voltage source; and
      an output node between the first transistor and the second transistor, the first transistor and the second transistor being configured to control an output voltage of the output node in an output voltage range;
a first operational amplifier having a first operating voltage range, an output of the first operational amplifier being connected to a gate electrode of the first transistor, the first operating voltage range being smaller than the output voltage range;
a second operational amplifier having a second operating voltage range, an output of the second operational amplifier being connected to a gate electrode of the second transistor; and
a feedback network coupled between the output node and non-inverting inputs of the first and second operational amplifiers to provide a feedback voltage to the first and second operational amplifiers, the feedback network being configured to shift the feedback voltage from the output voltage range to the first and second operating voltage ranges,
wherein the feedback network comprises a passive voltage divider.

10. A display device comprising:
a display unit comprising a plurality of pixels at crossing regions of a plurality of scan lines and a plurality of data lines;
a scan driver coupled to the scan lines;
a data driver comprising a plurality of column drivers coupled to the data lines, each of the column drivers comprising:
an output stage comprising:
a first transistor and a second transistor coupled in series between an output high voltage source and an output low voltage source; and
an output node between the first transistor and the second transistor, the first transistor and the second transistor being configured to control an output voltage of the output node in an output voltage range;
a first operational amplifier having a first operating voltage range, an output of the first operational amplifier being connected to a gate electrode of the first transistor, an inverting input of the first operational amplifier being configured to receive a first input voltage in the first operating voltage range, the first operating voltage range being smaller than the output voltage range;
a second operational amplifier having a second operating voltage range, an output of the second operational amplifier being connected to a gate electrode of the second transistor, an inverting input of the second operational amplifier being configured to receive a second input voltage in the second operating voltage range, the second operating voltage range being different from the first operating voltage range; and
a feedback network coupled between the output node and non-inverting inputs of the first and second operational amplifiers to provide a feedback voltage to the first and second operational amplifiers, the feedback network being configured to shift the feedback voltage from the output voltage range to the first and second operating voltage ranges.

11. The display device of claim 10, wherein each column driver comprises an input coupled to the first operational amplifier and the second operational amplifier, and wherein the display device further comprises a plurality of digital-to-analog converters (DACs) coupled to the inputs of the column drivers.

12. The display device of claim 11, further comprising a plurality of multiplexers coupled between the DACs and the inputs of the column drivers.

13. The display device of claim 12, wherein a first multiplexer of the multiplexers has a first input coupled to a first digital-to-analog converter (DAC) of the DACs, a second input coupled to a second DAC of the DACs, and an output coupled to an input of a first column driver of the column drivers, the first DAC being configured to output signals having a first polarity,
wherein a second multiplexer of the multiplexers has a first input coupled to the first digital-to-analog converter (DAC) of the DACs, a second input coupled to the second DAC of the DACs, and an output coupled to an input of a second column driver of the column drivers, the second DAC being configured to output signals having a second polarity different from the first polarity,
wherein the first multiplexer is configured to alternatingly couple the first and second DACs to the first column driver, and
wherein the second multiplexer is configured to alternatingly couple the second and first DACs to the second column driver.

14. The display device of claim 11, wherein the inverting input of the first operational amplifier is coupled to the input of the column driver, and
wherein the column driver further comprises a voltage level shifter coupled between the input of the column driver and the inverting input of the second operational amplifier, the voltage level shifter being configured to shift a voltage signal from the first operating voltage range to the second operating voltage range.

15. The display device of claim 10, wherein the first transistor and second transistor are LDMOS transistors.

16. The display device of claim 15, wherein the first transistor is a p-type LDMOS transistor and the second transistor is an n-type LDMOS transistor.

17. The display device of claim 10, wherein the first operational amplifier is coupled to the output high voltage source and a first intermediate voltage source,
wherein a voltage range between the output high voltage source and the first intermediate voltage source corresponds to the first operating voltage range,
wherein the second operational amplifier is coupled to the output low voltage source and a second intermediate voltage source, and
wherein a voltage difference between the output low voltage source and the second intermediate voltage source corresponds to the second operating voltage range.

18. The display device of claim 17, wherein the first intermediate voltage source and the second intermediate voltage source are configured to supply the same voltage.

19. The display device of claim 17, wherein the first intermediate voltage source and the second intermediate voltage source are configured to supply different voltages.

20. The column driver of claim 10, wherein the feedback network comprises a passive voltage divider.

* * * * *